(12) United States Patent
Mucha (10) Patent No.: US 6,682,999 B1
(45) Date of Patent: Jan. 27, 2004

(54) SEMICONDUCTOR DEVICE HAVING MULTILEVEL INTERCONNECTIONS AND METHOD OF MANUFACTURE THEREOF

(75) Inventor: John A. Mucha, Austin, TX (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/426,124

(22) Filed: Oct. 22, 1999

(51) Int. Cl.$^7$ .......................................... H01L 21/4763
(52) U.S. Cl. ...................... 438/620; 438/624; 438/638; 438/639
(58) Field of Search .......................... 257/758; 438/620, 438/624, 633, 638, 639, 672

(56) References Cited

U.S. PATENT DOCUMENTS

| | | | |
|---|---|---|---|
| 3,853,715 A | 12/1974 | Romankiw | |
| 4,789,648 A | 12/1988 | Chow et al. | |
| 5,075,762 A | * 12/1991 | Kondo et al. | 357/71 |
| 5,397,910 A | * 3/1995 | Ishimaru | 257/387 |
| 5,538,922 A | * 7/1996 | Cooper et al. | |
| 5,612,254 A | * 3/1997 | Mu et al. | |
| 5,976,920 A | * 11/1999 | Nakano et al. | 438/172 |
| 6,156,639 A | * 12/2000 | Fukao et al. | 438/629 |
| 6,232,221 B1 | * 5/2001 | Tran et al. | 438/637 |
| 6,395,164 B1 | * 5/2002 | Andricacos et al. | 205/157 |

* cited by examiner

Primary Examiner—W. David Coleman
Assistant Examiner—Hsien-Ming Lee (57) ABSTRACT

The present invention provides, in one aspect, a method for fabricating an interconnect system within a semiconductor device. In this particular embodiment, the method comprises forming a conductive layer over a substrate of the semiconductor device, such as a dielectric material, forming a photoresist layer over the conductive layer and patterning the photoresist, forming a selected portion and an unselected portion of the conductive layer, altering the selected portion such that the selected portion has an etch rate different from an etch rate of the unselected portion, and forming an interconnect on the selected or unselected portion. As used herein, the selected portion is defined as that portion of the conductive layer, such as a blanket seed layer, that is subject to the alteration process as discussed herein. The selected portion may be, depending on the embodiment, within a footprint of the interconnect or outside the footprint of the interconnect.

35 Claims, 7 Drawing Sheets

SEMICONDUCTOR DEVICE HAVING MULTILEVEL INTERCONNECTIONS AND METHOD OF MANUFACTURE THEREOF

TECHNICAL FIELD OF THE INVENTION

The present invention is directed, in general, to a method of fabricating a semiconductor device and, more specifically, to a semiconductor device having multilevel interconnections and a method of manufacture thereof.

BACKGROUND OF THE INVENTION

The semiconductor industry is currently moving toward low dielectric constant (low-k) materials and copper metal to form interconnections for semiconductor devices to reduce resistive capacitance delays associated with the higher dielectric constant of silicon dioxide. These low-k materials also are used to reduce RC delays of aluminum interconnections and higher densities of a is conductor per unit are of the device. Furthermore, industry is presently moving away from metal etching of conductor lines followed by gap-fill with a low-k dielectric because copper metal is difficult to etch. In place of these processes, the industry has adopted damascene strategies for fabricating these interconnections that first etch patterns into the low-k material and then fills the structures with metal. Damascene processing has fewer manufacturing steps per completed metal layer, and considering that devices of the near future will require as many as seven inter-level connections, such as vias, and a corresponding number of intra-level connections, such as wires or lines, damascene processing should lead to considerable cost and performance gains over traditional interconnect processing. Additionally, dual damascene strategies where both the via and wire are patterned simultaneously etched and simultaneously filled with metal, further reducing the number of processing steps.

These damascene processes are not without their problems, however. Some of those problems arise with respect to the use of hard masks and critical dimension control. In the damascene approach as line widths shrink, it has become increasingly difficult to apply a copper seed layer to allow a complete fill by electroplating processes. Furthermore, during etching of the damascene structures, the selectivity of etching low-k materials, which are frequently polymeric materials, in the presence of photoresist is poor and requires inorganic dielectric etch stops to allow for over-etching and resist strip. During etching, there is a danger of undercutting the hard mask forming an area that is difficult to completely cover in subsequent deposition processes, resulting in a void. Thus, deposition of barriers to prevent copper diffusion and deposition of copper seed for electroplating are difficult processing steps, particularly given the high aspect ratios associated with today's submicron technologies that are less than 0.25 μm. Because of these high aspect ratios, the step coverage of severe topography is frequently insufficient and results in incomplete coverage of the feature sidewalls and bottom that leads to thin or missing barrier material and copper seed resulting in barrier failure or void formation during plating. Also, void-free fill of metal by electroplating is difficult since plating tends to cover topography conformally leading to a seam in the center of the feature. This can form a region of high electromigration probability that reduces device reliability. Additionally, the seam-void can also act as a trap for liquid plating solution that can "explode" during subsequent processing steps that achieve temperatures above the boiling point of the trapped liquid. Since plating tends to occur conformally, areas with a high density of small features tend to fill faster than larger open areas. As a result metal, must be plated to a thickness at least as the depth of the largest feature. This forms topography of varying heights that are difficult to planarize with chemical mechanical polishing (CMP) processes.

Accordingly, what is needed in the art is a method and resulting device that avoid the problems associated with the above-discussed processes.

SUMMARY OF THE INVENTION

To address the above-discussed deficiencies of the prior art, the present invention provides, in one aspect, a method for fabricating an interconnect system within a semiconductor device. In this particular embodiment, the method comprises forming a conductive layer over a substrate of the semiconductor device, such as a dielectric material, forming a photoresist layer over the conductive layer and patterning the photoresist, forming a selected portion and an unselected portion of the conductive layer, altering the selected portion such that the selected portion has an etch rate different from an etch rate of the unselected portion, and forming an interconnect on the selected or unselected portion. As used herein, the selected portion is defined as that portion of the conductive layer, such as a blanket seed layer, that is subject to the alteration process as discussed herein. The selected portion may be, depending on the embodiment, within a footprint of the interconnect or outside the footprint of the interconnect. The interconnect structure formed by the present invention includes interconnect lines, contact plugs or metal filled interconnect vias.

Thus in a broad scope, the present invention provides a method of uniformly forming a conductive layer on which an interconnect is formed within a patterned photoresist. Because of the uniformity with which the conductive layer is formed and its presence only at the bottom of the pattern, problems, such as the occurrence of voids within the interconnect, that arise due to conformal plating of aspect ratios associated with present day and future submicron technologies can be avoided, thereby, providing a more reliable interconnect within a semiconductor device. Moreover, the present invention eliminates the need for critical etches and highly conformal seed for electroplating.

In one embodiment, forming an interconnect on the selected portion includes forming an interconnect on the selected portion and the method further comprises removing a substantial portion of the unselected portion from a region around the interconnect. The term "substantial" as used herein is used to account for unintentional trace amounts that might remain due to inefficiencies in the removal process. In this embodiment, the selected portion is subjected to the alteration process wherein its etch rate is altered to have an etch rate less than an etch rate of the unselected portion. Thus, the unselected portion is more easily removed by the etching process.

In another embodiment, forming an interconnect includes forming an interconnect on the unselected portion and the method further comprises removing a substantial portion of the selected portion from a region around and outside of the interconnect's footprint. In this embodiment, the selected portion is subjected to the alteration process wherein its etch rate is altered to have an etch rate greater than an etch rate of the unselected portion. Thus, the selected portion is more easily removed by the etching process.

Various processes may be used to alter the selected portions of the conductive layer. For example, the process may include subjecting the selected portion to an ion bombardment process, or, the process may include subjecting the selected portion to a nitridation, oxidation or halogenation processes. Alternatively, altering may include alloying and forming compositions of the selected portion with another metal from Groups IIA–VA or a transition metal or a lanthanide metal. Compositions of the selected portion and the interconnect metal are particularly advantageous. In such embodiments, the interconnect metal and the conductive layer should be chosen so that they will interdiffuse or alloy under the desired processing conditions. For example, the conductive layer metal may be Group II metals, such as magnesium, or antimony. Other exemplary conductive layer metals may include titanium, zirconium, zinc, tin, lead, niobium, chromium, molybdenum europium, tungsten, palladium, or aluminum when the metal used to form the interconnect is copper or silver. Yet other metals may include Group VA metals, such as antimony, transition metals, such as tungsten or lanthanide metals, such as neodymium. In yet another aspect of this particular embodiment, forming an alloy may also include forming a diffusion barrier to prevent interconnect metal from diffusing into materials that contact the interconnect.

Altering may also include interdiffusing the selected portion and the interconnect. Preferably, the interdiffusion forms a barrier layer between the interconnect and surrounding dielectric.

In another embodiment, the method further comprises removing the photoresist and the unselected portion outside a footprint of the interconnect and forming a dielectric layer over the interconnect subsequent to removing the photoresist and the unselected portion outside the footprint. The dielectric layer may be deposited by a vapor or liquid and may be comprised of a homogeneous or heterogeneous composition. In another embodiment, forming and patterning the photoresist layer includes forming a seed layer that comprises the metal used to form the interconnect by a directional deposition process.

In those embodiments where the interconnect is formed on a dielectric material, forming the conductive layer includes forming the conductive layer in such a way as to form a barrier layer between the interconnect and the substrate.

The present invention provides yet another unique aspect of forming an interconnect. In this particular embodiment, forming an interconnect includes forming a suspended, multilevel interconnect that is preferably formed on a single conductive layer. This particular embodiment may further include forming a barrier layer between the interconnect and the substrate. In one aspect of this particular advantageous embodiment, forming the suspended interconnect includes forming and patterning a subsequent photoresist layer on the interconnect, forming a subsequent interconnect pattern on or in the subsequent photoresist layer such that the subsequent interconnect physically contacts the interconnect. After the formation of the interconnect, the photoresist and the subsequent photoresist are simultaneously removed. In another aspect, the method further comprises simultaneously forming with the suspended interconnect, a support structure for the suspended interconnect.

In another aspect, the present invention provides a method for fabricating a semiconductor device, on a semiconductor wafer. In this particular embodiment, the method includes forming a dielectric layer over an active device formed on the semiconductor wafer, forming a blanket conductive seed layer over the dielectric layer, forming a photoresist layer over the conductive seed layer and patterning the photoresist, forming a selected portion and an unselected portion of the conductive seed layer, altering the selected portion such that the selected portion has an etch rate different from an etch rate of the unselected portion, and forming an interconnect on the selected or unselected portion.

Another embodiment is directed to a semiconductor device that includes an active device region, a blanket, conductive layer formed over the active device region, and a suspended interconnect formed on the conductive layer as is discussed below. In this particular embodiment, the device further includes a suspended interconnect support structure, such as a bond pad, that is electrically connected to the suspended interconnect. This embodiment may further include a plurality of electrically connected interconnect lines, contact plugs, or metal filled vias formed on different levels of the semiconductor device. The various levels of interconnect structure may be electrically isolated by a gaseous dielectric, such as a rare gas, nitrogen, forming gas, sulfur hexafluoride, or vacuum, in place of conventional dielectric materials. Preferably, the dielectric has a dielectric constant of less than about 2.3.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiments as a basis for designing or modifying other structures for carrying out the same purposes of the present invention. Those skilled in the art should also realize that such equivalent constructions do not depart from the spirit and scope of the invention in its broadest form. dr

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
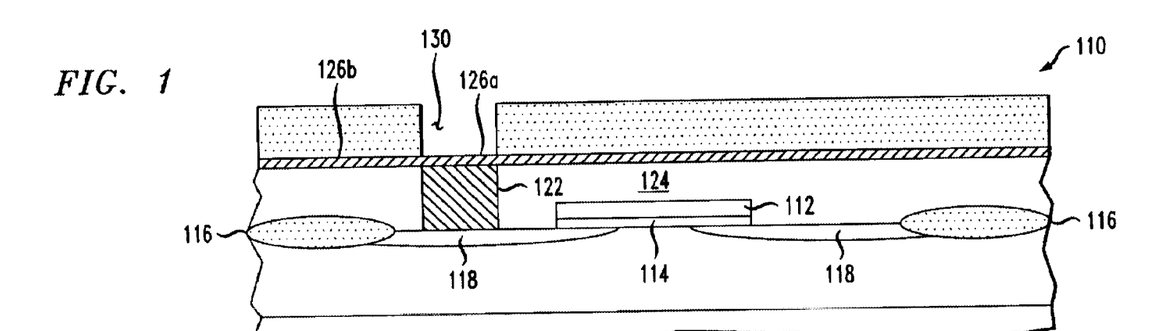
FIG. 1 illustrates a schematic sectional view of an active device having a uniform blanket conductive layer and a photoresist formed thereon.

Referring initially to FIG. 1, there is illustrated a schematic sectional view of a semiconductor device 110 in an intermediate step of fabrication. The semiconductor device 110 includes a gate 112, a gate oxide 114, field oxides 116 and source and drain regions 118, all of which form an active region 120 of the semiconductor device 110. A contact plug 122 is conventionally formed in a substrate 124, such as dielectric layer one (D1). At this particular point of fabrication, the semiconductor device 110 is of conventional design with respect to the active region 120 and the contact plug 122 and substrate 124. However, it is quite different from conventional designs with respect to a conductive layer 126 that is formed over the substrate 124. Following the deposition of the conductive layer 126, a photoresist layer 128 is formed over the conductive layer 126. The conductive layer 126 can act or function as a seed layer on which an interconnect metal, such as copper or silver, can be formed by, for example, an electroplating process. In general, elements chosen from Groups II through V, periods 3 through 6 of the Periodic Table, with bulk resistivities less than 100 $\mu\Omega$-cm are best used for the conductive layer 126. It is preferable that the conductive layer 126 is not easily oxidize significantly in air, and is easily converted to a volatile halide on exposure to molecular halogen, interhalogen, or dissociated gases containing elemental halogen. It is also preferable that the conductive layer 126 dissolve in either a liquid that does not dissolve copper or silver before or after being treated with a halogen as discussed above. In this particular view, the photoresist 128 has been patterned and developed to form an opening 130 within the photoresist 128 to form a selected portion 126a of the conductive layer 126 and an unselected portion 126b of the conductive layer 126. As stated above, the selected portion is that portion of the conductive layer 126 that will be altered either physically or chemically or both as discussed below.

The present invention, therefore, provides a method of uniformly forming a conductive or seed layer on which an interconnect is formed within a patterned photoresist. The conductive layer 126 can be used to carry the cathodic current required for the electrodeposition of interconnect metals, such as copper. Because of the location of the conductive layer 126 at the bottom of the defined feature, problems, such as the occurrence of voids within the interconnect, that arise due to the aspect ratios associated with present day submicron technologies, such as CMOS, PMOS, NMOS and Bipolar devices, can be avoided, thereby, providing a more reliable interconnect within a semiconductor device. As discussed in more detail below, the present invention may be applicable to various types of interconnect structures, such as contacts, VIAs or lines.

Figure 2:
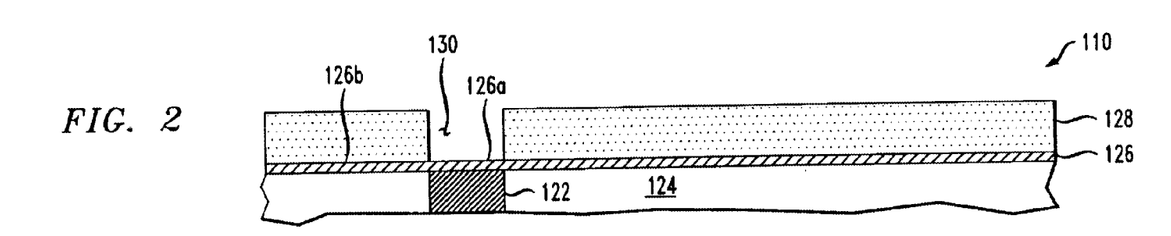
FIG. 2 illustrates an enlarged sectional view of a top section of FIG. 1 showing a selected portion of the conductive layer.

FIG. 2 illustrates an intermediate step of fabrication in one embodiment where the selected portion 126a may be altered (i.e., either a chemical or physical property of the selected portion 126a is changed) such that it has an etching rate that is different from the etch rate of the unselected portion 126b. In other words, areas for deposition may be defined by the patterned photoresist layer 128 with selected areas where deposition or electroplating can occur. To alter the selected portion 126a, it is chemically or physically treated through patterned opening 130 formed in the photoresist layer 128. The purpose of this treatment may be: 1) to form a barrier to diffusion of conductor metal when necessary or 2) to render the selected portion 126a area less reactive to the chemical etch subsequently used to remove the unselected portion 126b from a region around the interconnect structure, which in some embodiments will be outside the footprint of opening 130 in which an interconnect is ultimately formed. It should be understood that the unselected portion 126b may be removed from the region around the interconnect structure as design dictates, or it may be removed completely. In either case, however, the unselected portion 126b is substantially removed to the extent that it is intended to be removed from the substrate.

Various processes may be used to alter the selected portion 126a. For example, the process may include subjecting the selected portion 126a to an ion bombardment process. The elements that can be implanted, which are particularly advantageous include, boron, carbon, nitrogen, silicon, or other elements chosen from Groups II through V, periods 3 through 6, of the Periodic Table or transition metals or lanthanides that are capable of forming a barrier layer with the metal chosen for the conductive layer 126. The barrier layer inhibits chemical reaction or metal diffusion of the interconnect that will be formed in the opening 130 into a dielectric that is ultimately deposited over the interconnect. The selected portion 126a may also be altered by subjecting it to a nitridation or oxidation processes. The selected portion 126a may also be altered by, for example, ion bombardment, to form the barrier layer, if so desired. For example, when the selected portion 126a is tungsten, ion bombardment with silicon and nitrogen ions may be used to form tungsten silicide nitride compositions. In yet another embodiment, the conductive layer 126 is chosen from elements cited above that are capable of diffusing into the interconnect metal, such as magnesium or aluminum.

Figure 3:
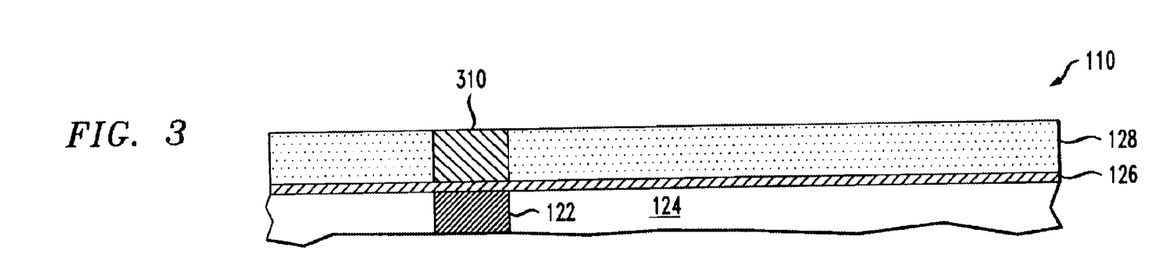
FIG. 3 illustrates the selected portion of FIG. 2 following plating that contacts the underlying metal through the blanket conductive layer.

After the altering step, an interconnect 310 is formed by depositing a conductive material, such as copper, into the opening 130 as illustrated in FIG. 3. The interconnect 310 may be formed by various conventional deposition and formation processes. However, in one particularly advantageous embodiment, the interconnect 310 is formed by electroplating a highly conductive metal, such as copper, within the opening 130 and onto the selected portion 126a. Because the conductive layer 126 is deposited before the intended interconnect pattern is formed, the conductive layer 126 is more uniformly deposited. Moreover, its presence only at the bottom of the patterned photoresist, which, in this case is the selected portion 126a, substantially reduces problems, such as the occurrence of voids within the interconnect that arise due to conformal plating of high aspect ratios. Both of these aspects provide a more reliable interconnect within a semiconductor device. In addition, the present invention eliminates the need for critical etches and highly conformal seed for electroplating.

Alternatively, altering may include alloying or interdiffusing the selected portion 126a with the metal that is used to form the interconnect. This particular altering process, of course, occurs when the interconnect metal 310 is formed on the selected portion 126a and the resist is removed. In such embodiments, the interconnect metal 310 and the conductive layer 126 should be chosen so that they will alloy or interdiffuse under the desired processing conditions. Elements capable of forming an alloy or interdiffusing with the interconnect metal 310 at <600° C. include: in addition to Group II through V metals, period 3 through 6, such as magnesium, aluminum, or tin; transition metals, such as zinc or lanthanum and lanthanide elements, such as neodymium. These elements may be used as the selected portion 126a of conductive layer 126 by themselves provided that the element-to-alloy etching selectivity is high, and preferably, the alloy is a suitable barrier for diffusion. The interconnect 310 is formed by depositing a conductive material, such as copper, into the opening 130. The interconnect 310 may be formed by various conventional deposition and formation processes. However, in one particularly advantageous embodiment, the interconnect 310 is formed by electroplating copper metal within the opening 130 and onto the selected portion 126a.

Figure 5:
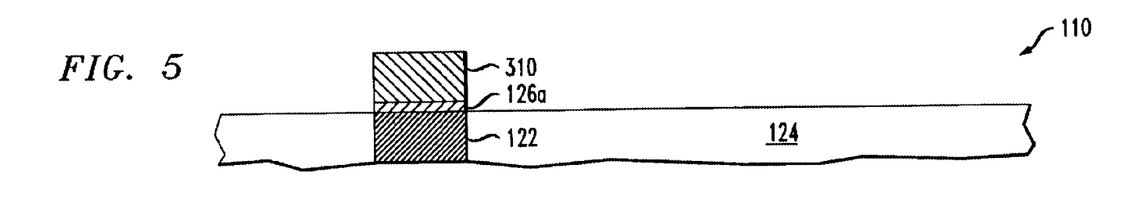
FIG. 5 illustrates the interconnect of FIG. 4 after the removal of the portion of the conductive layer outside the footprint of the interconnect metal.

In this embodiment, the conductor metal diffuses into the interconnect metal by bulk or grain-boundary diffusion such that, when thermally treated following resist stripping, the selected portion 126a in FIG. 5 essentially disappears, forming a region rich in interconnect metal. A particularly advantageous example of this embodiment occurs when the selected portion 126a of conductor metal diffuses out to the vertical surfaces of the interconnect 310. Following removal of the unselected portion 126a, a subsequent anneal in a reactive gas forms a barrier composition. For example, magnesium that diffuses to the outer surface of a copper interconnect is converted to a magnesium oxide composition that can act as a barrier to prevent copper diffusion into the intra layer dielectric.

Figure 4:
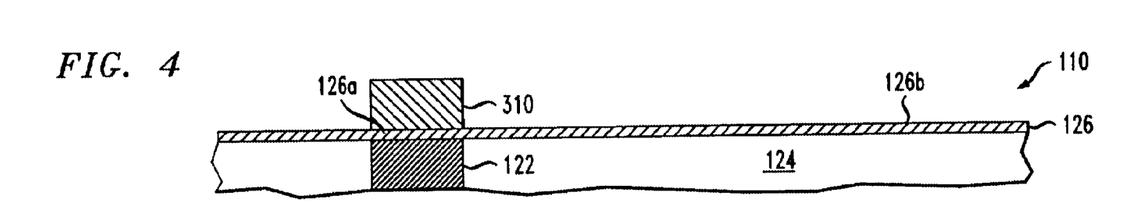
FIG. 4 illustrates the interconnect of FIG. 3 after the removal of the photoresist.

Turning now to FIG. 4, there is illustrated an alternative embodiment. FIG. 4 shows another intermediate step of fabrication wherein the photoresist has been removed after the formation of the interconnect 310. In this particular embodiment, selected portion 126b is formed that substantially lays in the region outside of the footprint of the interconnect 310, and the unselected portion is portion 126a that lays substantially within the footprint of the interconnect 310. The word substantially is used here to take into account normal dimensional variation or irregularities that result from the fabrication processes. In this particular embodiment, the alteration step has been deferred until after the formation of interconnect 310. With the unselected portion 126a protected by the interconnect 310, the selected portion 126b may be altered as previously described above such that its etching rate by a suitable etchant is greater than the unselected portion 126a.

Figure 6:
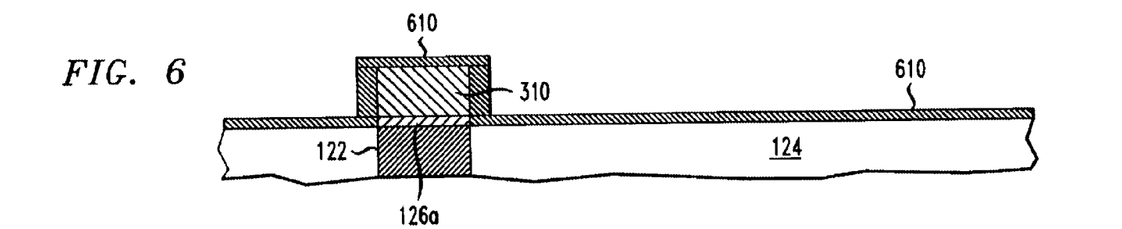
FIG. 6 illustrates a barrier layer formed over the interconnect of FIG. 5.
Figure 7:
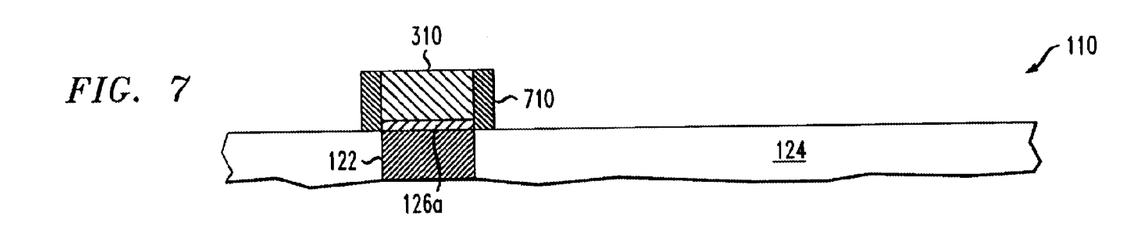
FIG. 7 illustrates the barrier layer and interconnect of FIG. 6 after a directional sputter/etch.
Figure 8:
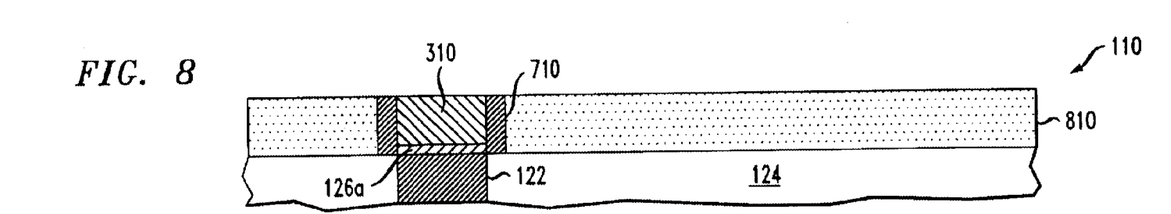
FIG. 8 illustrates the barrier layer and interconnect of FIG. 7 after the deposition and planarization of an intra metal dielectric.
Figure 9:
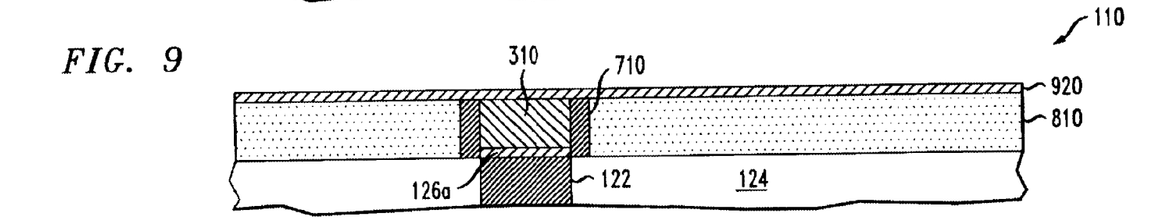
FIG. 9 illustrates the structure of FIG. 8 after the deposition of a subsequent conductive layer.

Turning now to FIG. 5, after either the selected portion 126 as mentioned above regarding FIG. 4 has been altered as discussed above, the selected portion 126b that resides outside the footprint of the interconnect 310 may be removed by conventional etching processes. Due to the different etch rates of the unselected portion 126a and the selected portion 126b as produced by the processes discussed above, the selected portion 126b that resides outside of the interconnect's 310 footprint is more easily removed by the etching process. As such, undercut etching of the interconnect 310 is substantially reduced. Following the removal of portion 126b, a barrier layer 610 may then be conventionally deposited, e.g., by chemical vapor deposition, over the interconnect 310 as shown in FIG. 6. The barrier layer 610 may be conventionally removed by, for example, a directional sputter/etch that removes the barrier layer 610 except on the sides of the interconnect 310, which forms a side barrier 710, as illustrated in FIG. 7. A subsequent dielectric layer 810 is then deposited over the interconnect 310 and conventionally planarized as illustrated in FIG. 8. A subsequent conductive layer 920 is then formed on the dielectric layer 810 in the same manner discussed above for the conductive layer 126, as illustrated in FIG. 9.

Figure 10A:
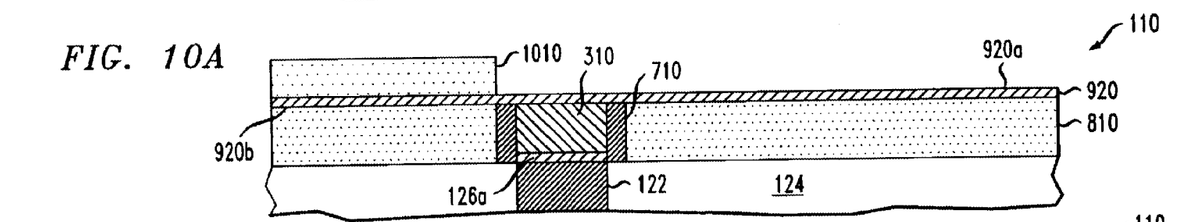
FIG. 10A illustrates the structure of FIG. 9 after depositing and patterning a subsequent layer of photoresist and altering the selected portion.
Figure 10B:
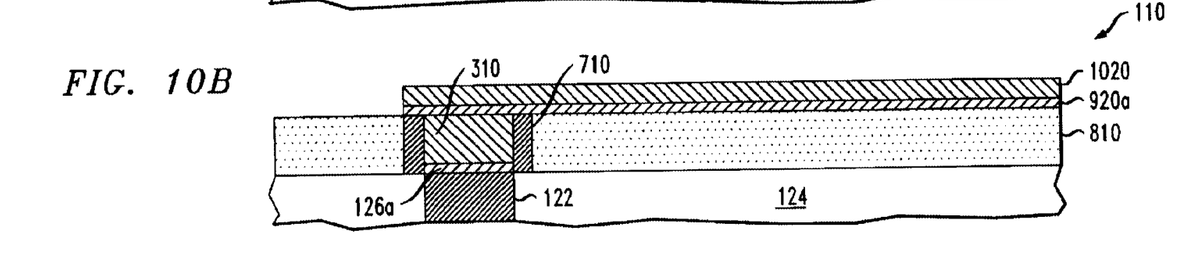
FIG. 10B illustrates the structure of FIG. 10A after formation of a subsequent interconnect ion metal, removal of photoresist and removal of the conductive layer outside the footprint of the interconnect metal.

Turning now to FIGS. 10A–10B, there is illustrated an embodiment in which a subsequent patterned photoresist layer 1010 is formed over the conductive layer 920. In this particular embodiment, the selected portion 920a is subjected to the altering step as discussed above while the unselected portion 920b remains protected from the altering step by the photoresist layer 1010. After the selected portion 920a is altered and interconnect deposition is conducted as discussed above, the photoresist 1010 and the unselected portion 920b are removed, leaving the interconnect structure 1020, which may be a line, as illustrated in FIG. 10B.

Referring again to FIGS. 2–7, another aspect of the present invention provides a method where electrodeposition is performed with the patterned photoresist in place such that the interconnect metal is deposited from the top of selected portion 126a to the top of the photoresist layer 128. Subsequently, the photoresist layer 128 may then removed by an isotropic etching process. At this point, a barrier layer, like the one discussed above regarding FIGS. 6 and 7, can be applied to portion 126b and simultaneously to the surfaces of interconnect metal 310 by electrodeposition or chemical vapor deposition. In those embodiments where electrodeposition is used, the selected portion 126a functions as the cathode conductor. The barrier layer 610 deposited on horizontal surfaces and the portion 126b may then be removed by a directional etching process, such as reactive ion etching (RIE). The resulting pattern is then covered with dielectric material and planarized back to the top of the metal pattern by chemical/mechanical polishing or a planarizing etch. This embodiment can be repeated for subsequent levels of metallization.

One important element of the method described herein includes the alternation of chemical properties of the selected portion of the conductive layer 126, such that the selected portions within the footprint of the interconnect metal etch slower so that the portions of the conductive layer 126 between interconnect metal lines or vias may be selectively removed. Another important element includes the ability to use the conductive layer 126 or altered portions of the conductive layer 126 as a diffusion layer around the interconnect. These can be achieved by a variety of methods as discussed above.

For resist patterns forming long lines, a thin copper seed may be applied directionally such that current spreads along the bottom of the line to allow plating from the bottom-up. This sequence of process steps described herein eliminates the need for critical etches of interconnect metal and intra level dielectric and does not require a seed layer on the sidewalls of damascene features to ensure electrical continuity for electroplating. It should be noted that only the photoresist patterning step controls the dimensions of interconnect metal and all subsequent etches to remove unneeded portions of the blanket conductor layer or portion of dielectric and all depositions of intra level dielectric, interconnect metal, and barrier layers are self-aligned.

The present invention provides yet another unique aspect of forming an interconnect, as generally and schematically illustrated in FIGS. 11A–11E. In this particular embodiment, a suspended, multilevel interconnect 1120 is formed on a single conductive layer 1130. Portions of seed layer, which are deposited on photoresist at the tops of trenches, are electrically isolated so that no plating occurs on top surfaces. This material can be removed by a dilute acid clean with minimal loss of interconnection metal.

In one fabrication method, a dielectric layer 1140 is formed and a photoresist is conventionally deposited, patterned and etched to form a contact opening within the photoresist. A contact plug 1150 is then conventionally formed in the opening and the contact plug 1150 and dielectric layer 1140 are then conventionally planarized. A conductive layer 1130 is then formed on the dielectric layer 1140 as discussed above for the other embodiments. A photoresist 1160 is formed on the conductive layer 1130, patterned and trench etched to form a selected portion 1130a of the single conductive layer 1130. The selected portion 1130a can be altered as discussed above with respect to the other embodiments, and if necessary, may also be altered in such a way to cause the selected portion 1130a to serve as a barrier layer as discussed above regarding other embodiments. In those embodiments directed toward the suspend structure, the selected are beneath the footprint of the first level interconnect is the one that is altered to be less reactive.

Additionally, when the interconnect pattern is a trench or line, it is advantageous to apply a thin, e.g., ≦5 nm, directionally deposited seed layer to the bottom of the trenches. The seed layer is preferably comprised of an interconnect metal. This will aid in rapidly forming a conduction layer to assure that bottom-up plating is maintained.

An interconnect metal is then deposited to form a subsequent interconnect 1170. Then a subsequent photoresist layer 1180 is deposited on the preceding metal interconnect 1170, patterned and metal is deposited to form another subsequent interconnect 1190. Subsequently, another photoresist layer 1192 is patterned, metal is deposited and another interconnect 1194 is formed. As easily seen, this sequence of patterning resist and depositing metal can be repeated for as many levels as the circuit design requires.

Figure 11A:
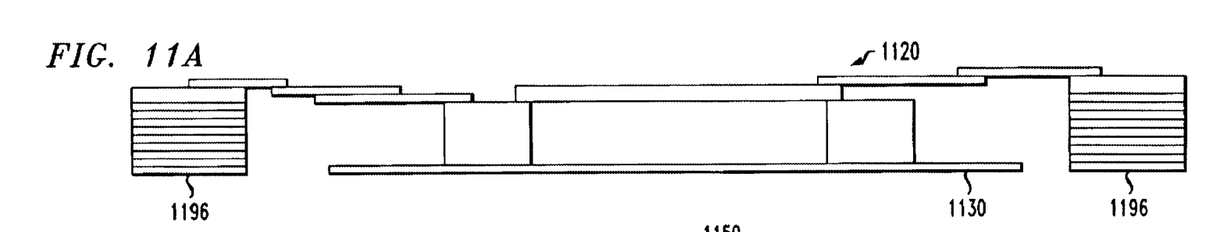
FIG. 11A illustrates a sectional view of a suspended interconnect structure.
Figure 11B:
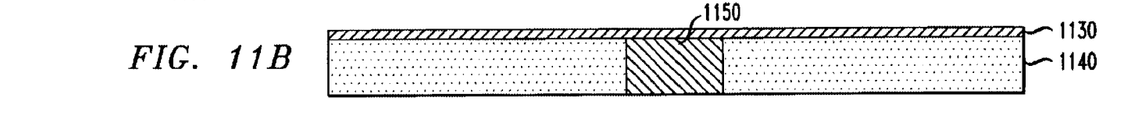
FIGS. 11B–11E illustrate sectional views of various intermediate steps during the formation of the suspended interconnect structure of FIG. 11A.
Figure 11C:
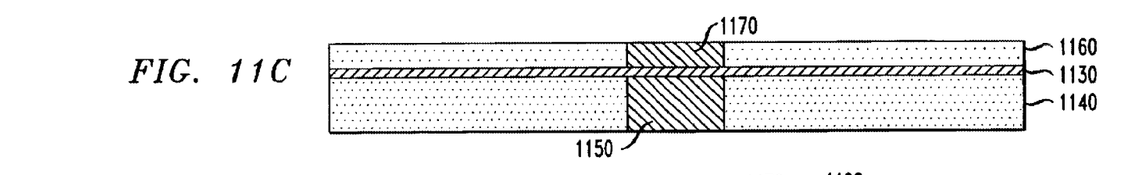
Figure 11D:
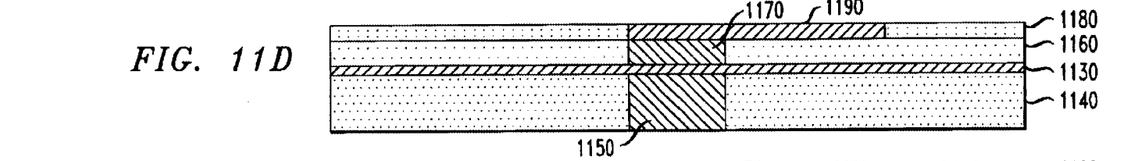
Figure 11E:
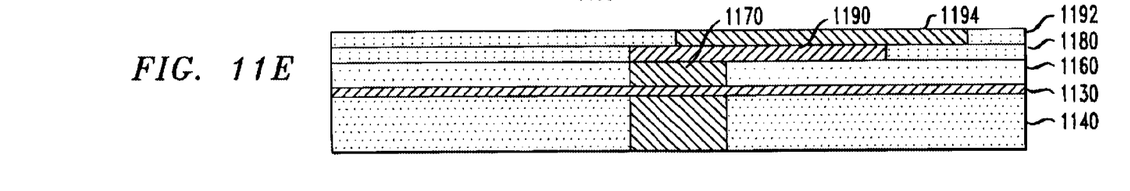

During the formation of the suspended interconnect 1120, a support structure 1196 is formed by stacking layers of material, which structurally support the fragile suspended interconnect 1120. Preferably, each layer of the support structure 1196 comprises the same metal used to form the interconnects, such as copper. At some point in the metal deposition, as chosen by the designer, contact between the fragile interconnections and the support structure 1196 is made to provide mechanical support and, if appropriately designed, electrical contact for the operation of the device. In a preferred embodiment, the upper most level of the support structure 1196 serves as a surface on which a bond pad may be formed.

When the final level is formed, a total photoresist strip of the device is performed, which removes essentially all of the photoresist between the upper most level and the first level. Because no dielectric is present except at the contact plug level, the resulting structure forms the multilevel suspended interconnect structure 1196 where a vacuum or gas or gas mixture, such as a rare gas and nitrogen or sulfur hexafluoride or a reducing gas composition, serves as the dielectric between the various metal interconnections.

Figure 12:
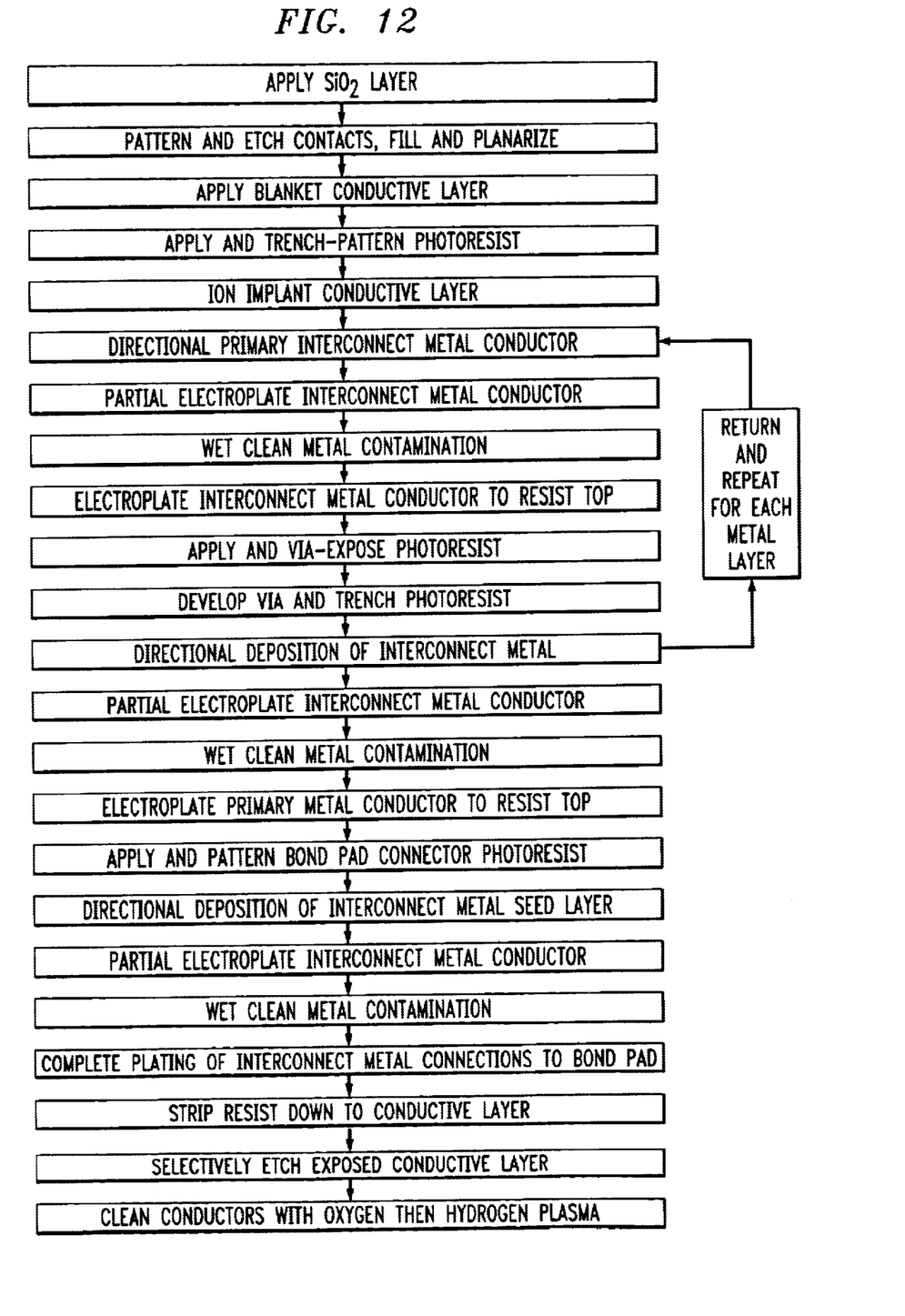
FIG. 12 illustrates a flow chart for process forming multilevel suspended interconnect structures.
Figure 13A:
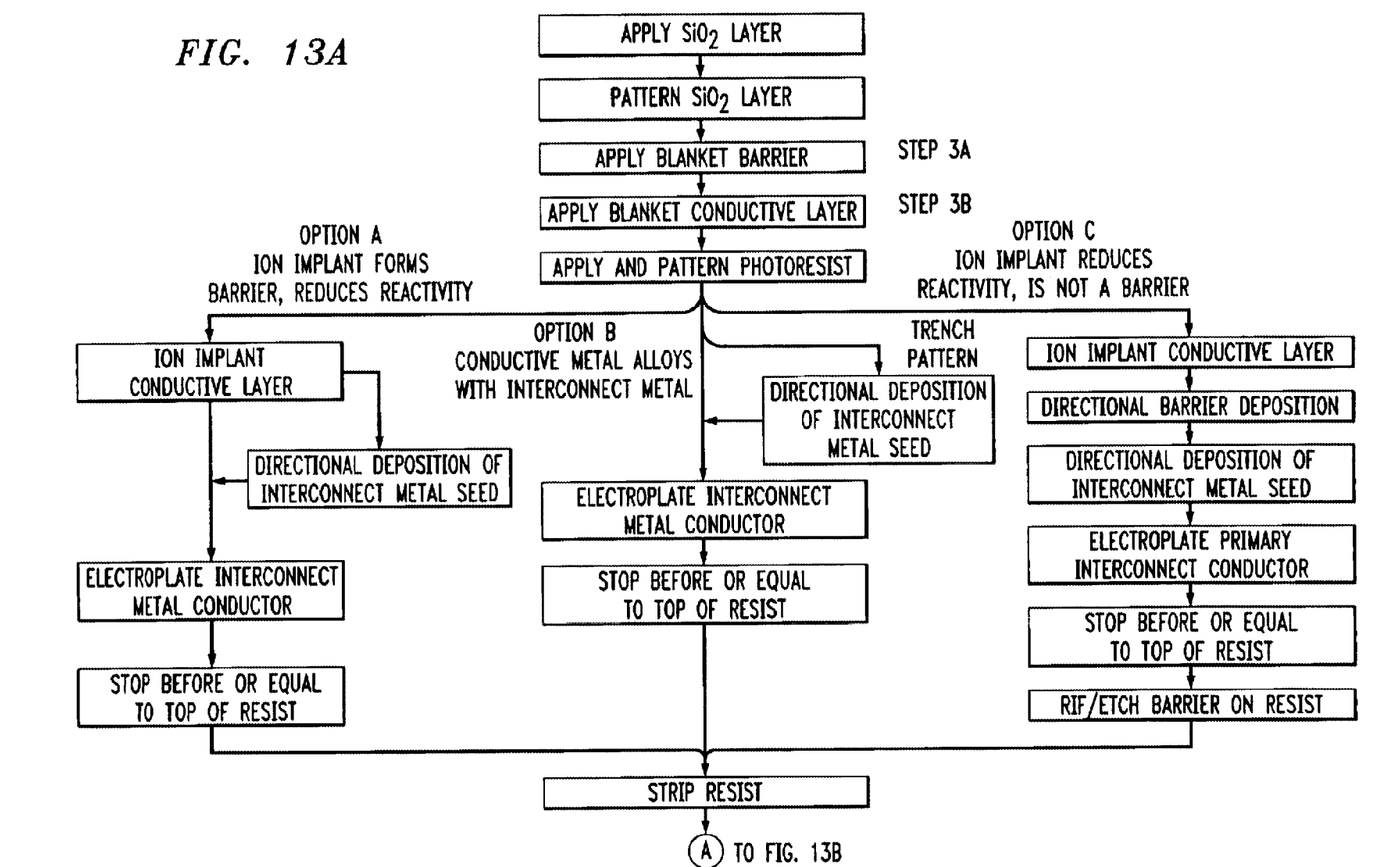
FIG. 13 illustrates a flow chart for process forming multi levels with intra metal dielectric one layer at a time.
Figure 13B:
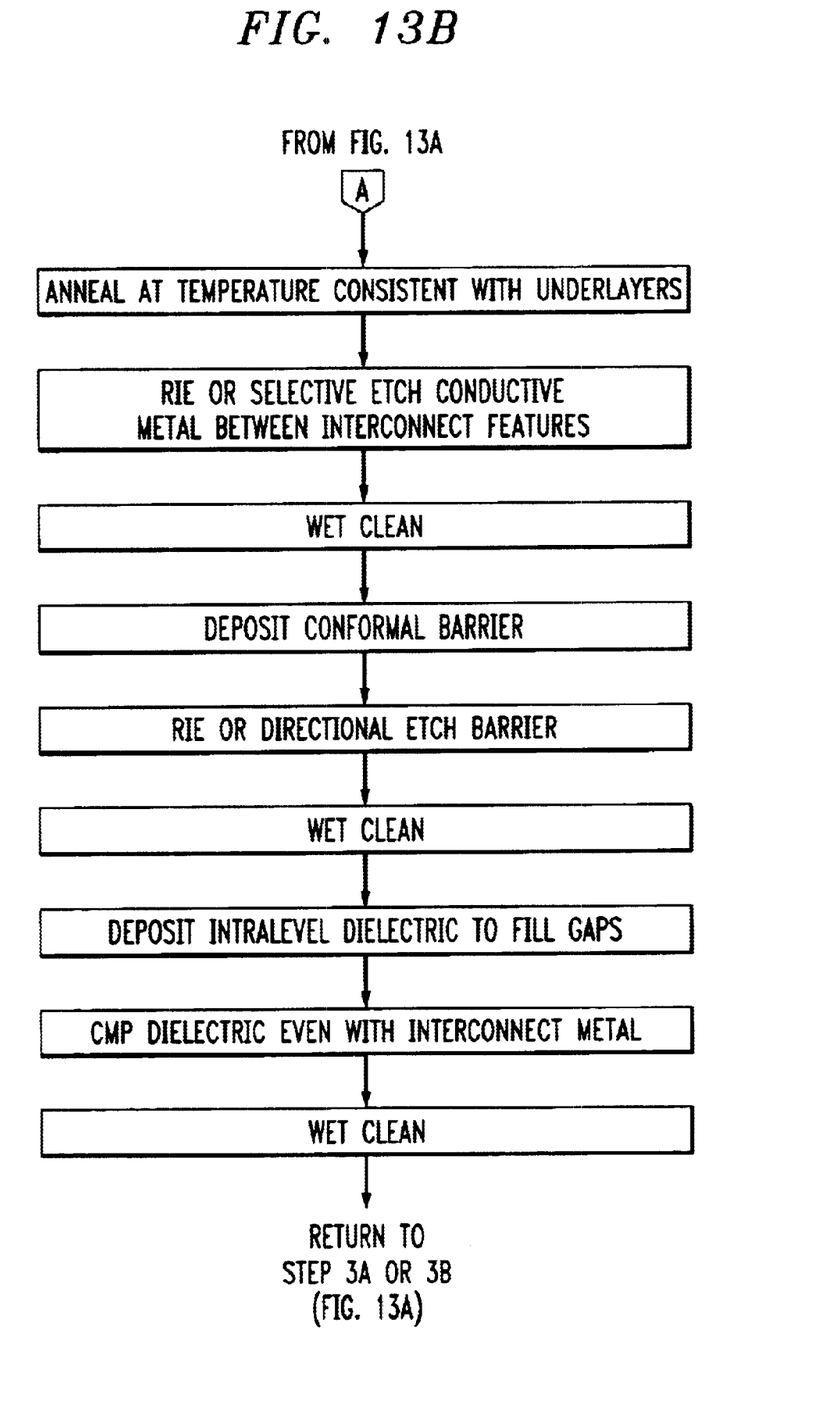

The above discussed embodiments are also generally set forth in FIGS. 12 and 13, which are flow charts showing the various steps. In some cases, additional steps to those set forth above are presented to illustrate decisions that can alter the process flow slightly, depending on choices of materials and design. FIG. 12 illustrates one embodiment of the steps involved in forming a suspended interconnect system as just discussed. FIG. 13 shows the various embodiments available in forming the interconnects discussed above with respect to FIGS. 1–10. It should be noted, however, that FIGS. 12 and 13 are not intended to restrict the broad scope of the present invention.

Although the present invention has been described in detail, those skilled in the art should understand that they can make various changes, substitutions and alterations herein without departing from the spirit and scope of the invention in its broadest form.

What is claimed is:

1. A method for fabricating an interconnect system on a semiconductor wafer, comprising:
   forming a metal conductive layer over a silicon substrate of the semiconductor wafer;
   forming a selected portion and an unselected portion of the metal conductive layer;
   altering the selected portion such that the selected portion has an etch rate different from an etch rate of the unselected portion;
   forming an interconnect structure on the unselected portion; and
   removing a substantial portion of the selected portion that lies outside a footprint of the interconnect structure, the unselected portion having an etch rate less than an etch rate of the selected portion.

2. The method as recited in claim 1 wherein altering includes subjecting the selected portion to an ion bombardment process.

3. The method as recited in claim 1 wherein altering includes subjecting the selected portion to a nitridation or oxidation processes.

4. The method as recited in claim 1 wherein altering includes forming an alloy from the selected portion and the interconnect structure.

5. The method as recited in claim 4 wherein forming an alloy includes forming a diffusion barrier.

6. The method as recited in claim 1 wherein altering includes interdiffusing the selected portion and the interconnect structure.

7. The method as recited in claim 1 wherein the interdiffusing includes forming a barrier layer.

8. The method as recited in claim 1 wherein forming an interconnect structure includes forming an interconnect line, a contact plug or a metal filled interconnect via.

9. The method as recited in claim 1 wherein forming a metal interconnect includes forming and patterning a photoresist layer over the conductive layer.

10. The method as recited in claim 9 further comprising removing the photoresist and removing the unselected portion outside a footprint of the interconnect, and then forming a dielectric layer over the interconnect.

11. The method as recited in claim 9 wherein forming an interconnect structure includes forming a suspended interconnect.

12. The method as recited in claim 11 wherein forming an interconnect structure includes forming a barrier layer between the interconnect structure and the substrate.

13. The method as recited in claim 11 wherein forming a suspended interconnect includes forming and patterning a subsequent photoresist layer on the suspended interconnect, forming a subsequent interconnect on or in the subsequent photoresist layer such that the subsequent interconnect contacts the suspended interconnect.

14. The method as recited in claim 13 further comprising simultaneously forming with the suspended interconnect, a support structure for the suspended interconnect.

15. The method as recited in claim 13 further including removing the photoresist layer and the subsequent photoresist layer.

16. The method as recited in claim 13 further comprising removing the unselected portion of the conductive layer outside of a footprint of the interconnect structure.

17. The method as recited in claim 9 wherein forming and patterning a photoresist layer includes forming a seed layer comprising interconnect metal on the patterned photoresist by a directional deposition process.

18. A method for fabricating a semiconductor device, on a semiconductor wafer, comprising:

forming a dielectric layer over an active device formed on the semiconductor wafer;

forming a metallic conductive seed layer over the dielectric layer;

forming a photoresist layer over the metallic conductive seed layer and patterning and removing the photoresist;

forming a selected portion and an unselected portion of the metallic conductive seed layer;

altering the selected portion such that the selected portion has an etch rate different from an etch rate of the unselected portion;

forming a metal interconnect on the unselected portion; and removing a substantial portion of the selected portion that lies outside a footprint of the metal interconnect, the unselected portion having an etch rate less than an etch rate of the selected portion.

19. The method as recited in claim 18 wherein altering includes subjecting the selected portion to an ion bombardment process.

20. The method as recited in claim 18 wherein altering includes subjecting the selected portion to a nitridation or oxidation processes.

21. The method as recited in claim 18 wherein altering includes forming an alloy from the selected portion and the metal interconnect.

22. The method as recited in claim 21 wherein forming an alloy includes forming a diffusion barrier.

23. The method as recited in claim 22 wherein interdiffusing includes forming a barrier layer.

24. The method as recited in claim 18 wherein altering includes interdiffusing the selected portion and the metal interconnect.

25. The method as recited in claim 18 further comprising removing the photoresist and the unselected portion outside a footprint of the metal interconnect, and forming a dielectric layer over the interconnect subsequent to removing the photoresist and the unselected portion outside the footprint of the interconnect.

26. The method as recited in claim 26 wherein forming a dielectric layer includes forming a dielectric layer from a vapor.

27. The method as recited in claim 25 wherein forming a dielectric layer includes forming a dielectric layer from a liquid.

28. The method as recited in claim 25 wherein forming a dielectric layer includes forming a homogeneous or heterogenous composition.

29. The method as recited in claim 18 wherein forming a metal interconnect includes forming a suspended interconnect.

30. The method as recited in claim 29 wherein forming a metal interconnect includes forming a barrier layer between the metal interconnect and the substrate.

31. The method as recited in claim 29 wherein forming a suspended interconnect includes forming and patterning a subsequent photoresist layer on the metal interconnect, forming a subsequent interconnect on or in the subsequent photoresist layer such that the subsequent interconnect contacts the metal interconnect.

32. The method as recited in claim 31 further comprising simultaneously forming with the suspended interconnect, a support structure for the suspended interconnect.

33. The method as recited in claim 34 further comprising removing the unselected portion outside of a footprint of the metal interconnect.

34. The method as recited in claim 18 wherein forming a metal interconnect includes forming a metal interconnect line, a contact plug or a metal filled interconnect via.

35. The method as recited in claim 18 wherein forming and patterning a photoresist layer includes forming a seed layer comprising interconnect metal on the patterned photoresist by a directional deposition process.

* * * * *